United States Patent
Andrews

(10) Patent No.: US 6,509,806 B2
(45) Date of Patent: Jan. 21, 2003

(54) ADJUSTING UNTRIMMED VCO DURING OPERATION OF THE OSCILLATOR

(75) Inventor: Joseph Andrews, San Marcos, CA (US)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 09/887,227

(22) Filed: Jun. 20, 2001

(65) Prior Publication Data

US 2001/0035796 A1 Nov. 1, 2001

Related U.S. Application Data

(62) Division of application No. 09/484,474, filed on Jan. 18, 2000.

(51) Int. Cl.[7] .................................................. H03B 5/20

(52) U.S. Cl. .............................. 331/117 R; 331/117 FE; 331/108 R

(58) Field of Search ......................... 331/107 R, 108 R, 331/109, 117 R, 117 FE, 110, 111

(56) References Cited

U.S. PATENT DOCUMENTS

| | | | | | |
|---|---|---|---|---|---|
| 4,185,247 A | * | 1/1980 | Harrison, Jr. | ................ | 327/107 |
| 4,646,035 A | * | 2/1987 | Chapelle | ................. | 331/177 R |
| 4,746,879 A | * | 5/1988 | Ma et al. | ...................... | 331/44 |
| 4,943,786 A | * | 7/1990 | Cordwell et al. | ........... | 331/1 A |
| 5,570,066 A | * | 10/1996 | Eberhardt et al. | ............ | 331/34 |
| 5,689,820 A | * | 11/1997 | Nahear et al. | ................ | 455/86 |
| 5,701,600 A | * | 12/1997 | Wetters et al. | .............. | 455/208 |
| 5,748,047 A | * | 5/1998 | Gurthrie et al. | .............. | 331/19 |
| 5,892,408 A | * | 4/1999 | Binder | ........................ | 331/44 |
| 5,912,595 A | * | 6/1999 | Ma et al. | ................ | 331/117 D |

\* cited by examiner

*Primary Examiner*—Tuan T. Lam
(74) *Attorney, Agent, or Firm*—Harness, Dickey & Pierce, PLC

(57) ABSTRACT

A frequency oscillator tuning process at the manufacturing stage is replaced with an adjustment of a resonant circuit in the frequency oscillator during an operation of the oscillator. The adjustment utilizes a crystal oscillator, a frequency oscillator such as a voltage-controlled oscillator (VCO), and a trimmer in a phase-locked loop configuration to determine a correction voltage required for an untrimmed VCO to operate at a nominally specified frequency by adjusting an input tuning voltage for a resonant circuit.

2 Claims, 8 Drawing Sheets

ADJUSTING UNTRIMMED VCO DURING OPERATION OF THE OSCILLATOR

This is a divisional of U.S. application Ser. No. 09/484,474, filed Jan. 18, 2000 (pending).

BACKGROUND

This invention relates to voltage-controlled oscillators.

A frequency oscillator, such as a voltage-controlled oscillator (VCO), is an important component in telecommunication and other devices. The VCO is used as a local oscillator for up/down converters in radio systems, and as a modem oscillator in virtually all wireless and cellular systems.

The VCO is often manually adjusted during manufacturing to trim the center frequency of the resonator. However, this trimming or tuning process occupies a significant portion of the cost of a VCO. Therefore, it is advantageous to design a system in which the tuning process during manufacturing can be eliminated.

SUMMARY

A frequency oscillator tuning process at the manufacturing stage is replaced with an adjustment of a resonant circuit in the frequency oscillator during the operation of the oscillator.

The technique utilizes a crystal oscillator, a frequency oscillator such as a voltage-controlled oscillator (VCO), and a trimmer in a phase-locked loop configuration to determine a correction voltage required for an untrimmed VCC to operate at a nominally specified frequency by adjusting an input tuning voltage for a resonant circuit.

The trimmer for adjusting an operating frequency of the VCO includes a storage element having a set of calibrated data corresponding to a set of input signals. The trimmer also includes a controller configured to utilize the set of calibrated data to provide an appropriate tuning signal for tuning the VCO to a nominally specified output frequency. In some embodiments, the trimmer involves searching a lookup table for a calibrated data corresponding to an input signal.

The frequency oscillator having the trimmer further includes
 a resonant circuit configured to receive the tuning signal from the trimmer and generate a wave energy signal of a particular frequency corresponding to the tuning signal, such that the particular frequency is substantially close to a nominally specified output frequency of the oscillator.

BRIEF DESCRIPTION OF THE DRAWINGS

Different aspects of the disclosure will be described in reference to the accompanying drawings wherein.

DESCRIPTION OF THE PREFERRED EMBODIMENTS

Figure 1:
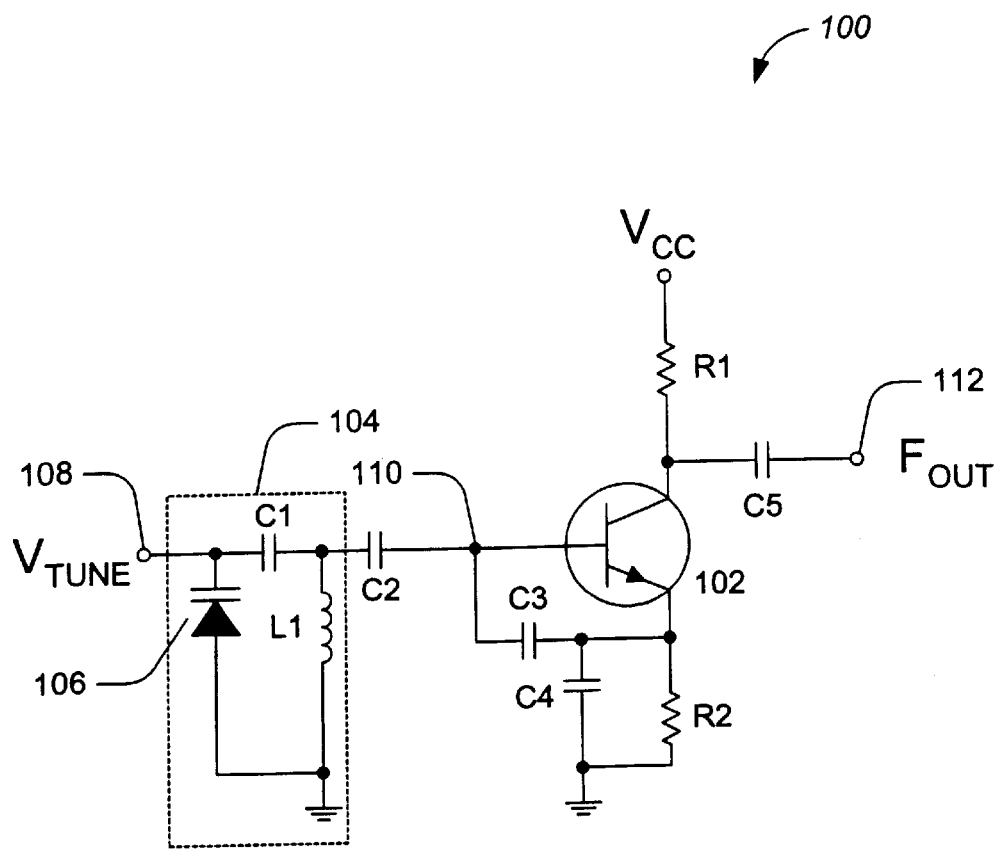
FIG. 1 is a schematic diagram a frequency oscillator such as a voltage-controlled oscillator.

One embodiment of a frequency oscillator 100, such as a voltage-controlled oscillator (VCO), is shown in FIG. 1. The output frequency of the VCO 100 is controlled by the impedance at the base 110 of the transistor presented by a resonant circuit 104. The VCO 100 includes a transistor 102 and an inductive resonant circuit 104 coupled with a respective variable reactance element 106, such as a voltage variable capacitor or varactor, which is responsive to a tuning signal 108, $V_{TUNE}$. The tuning signal 108 tunes the resonant circuit 104 within its operable predetermined frequency band. The tuning signal 108 normally tunes the resonant circuit 104 during manufacture to a nominally specified output frequency at a specified control voltage.

In particular, the base 110 of the transistor 102 is AC coupled to the resonant circuit 104 through a DC blocking capacitor C2. The resonant circuit 104 contains an LC circuit which resonates at a desired resonant frequency. The LC circuit forms an equivalent LC network with a capacitor C1 and an inductor L1. The resonant circuit 104 also includes a voltage variable reactance element 106 such as a varactor or variable diode 106. During the operation of the oscillator, the resonant circuit 104 is tuned to selected frequency channels within the operable frequency band. The varactor 106 is adjusted by a tuning signal 108 coupled to the varactor 106. As the tuning signal 108 is varied, the varactor 106 changes its capacitance and the resonant circuit 104 changes its operating frequency.

A feedback capacitor C3 is connected across the base and emitter of the transistor 102. Another feedback capacitor C4 is connected from the emitter connection to the ground. Resistors R1 and R2 are used as all-frequency chokes for the supply voltage Vp that bias the transistor 102. The collector of the transistor 102 is AC-coupled to the RF output 112 through a DC blocking capacitor C5.

Figure 2:
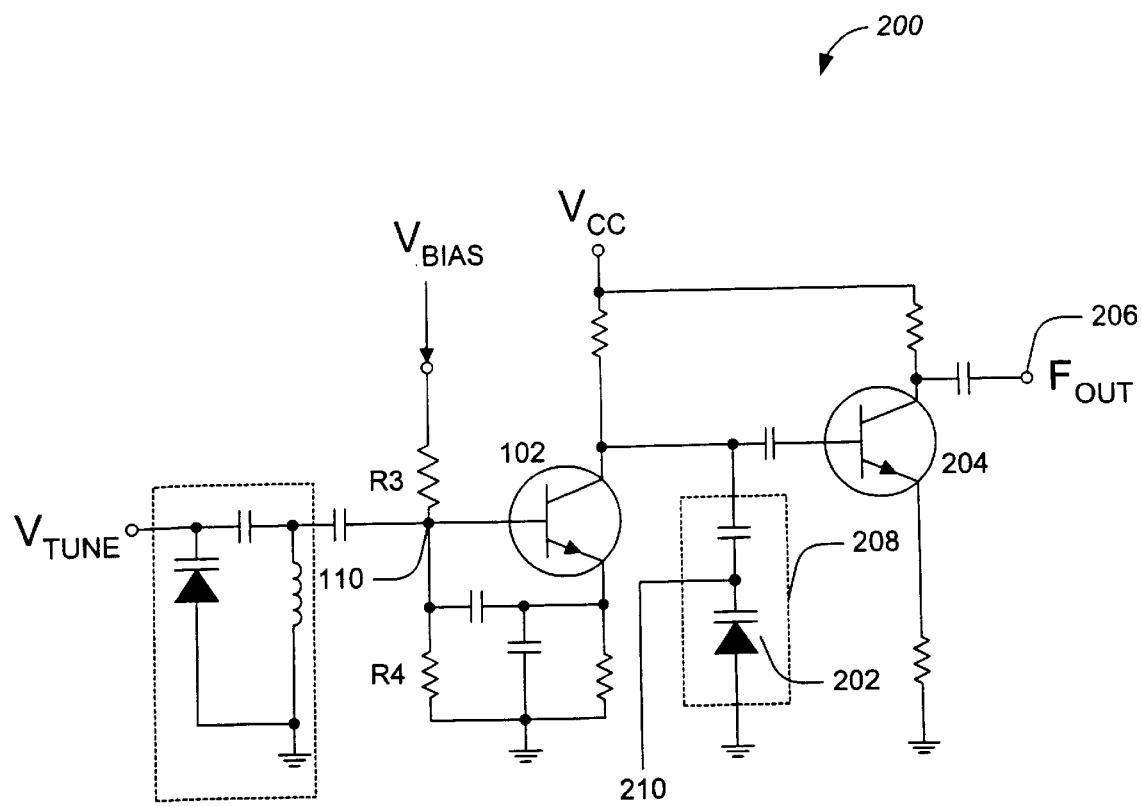
FIG. 2 is another schematic diagram of a frequency oscillator.

FIG. 2 shows an alternative embodiment of the frequency oscillator circuit 200 in which a fine tuning of the desired frequency is achieved by methods known as a frequency "pushing" and a frequency "pulling." The frequency pushing involves adjusting or altering the bias voltage of the oscillator at the base 110 of the transistor 102. The frequency pulling involves adjusting an output load 208 of the VCO circuit through a node 210.

The frequency pushing measures the sensitivity of the oscillator output frequency 206 to the bias voltage applied at the base 110 of the transistor 102 and is expressed in MHz/volt. The output frequency change corresponds to a given change in the bias voltage.

The frequency pulling measures the frequency change due to a non-ideal load. It is measured by noting the frequency change caused by a load 208 having an arbitrary return loss with all possible phases. The load 208 can be adjusted with a variable capacitor or varactor 202. An additional transistor 204 is configured to amplify the "frequency pulled" RF signal.

Figure 3:
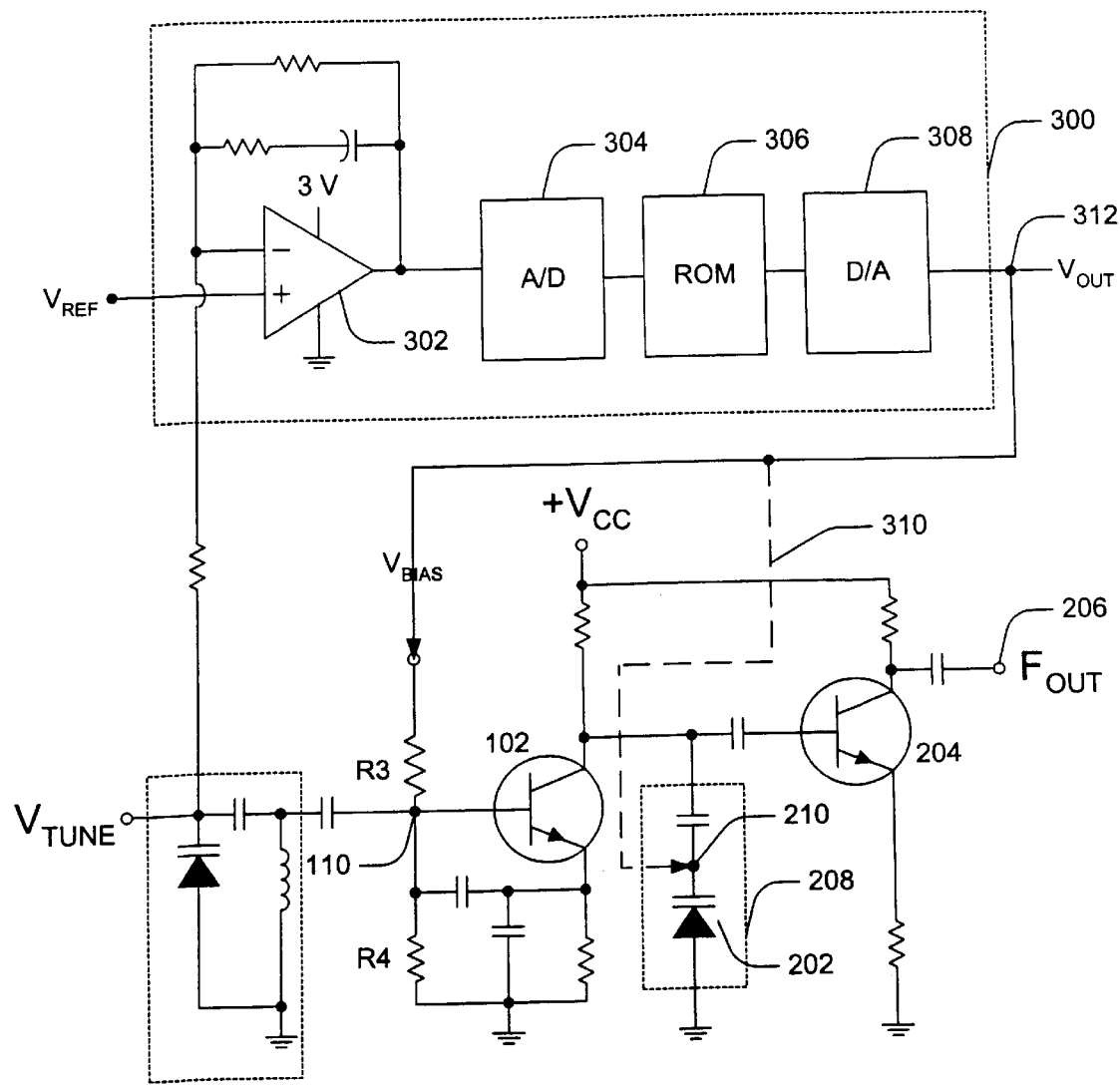
FIG. 3 is a block diagram of an input voltage tuner.

One embodiment of an input voltage tuner 300 for a VCO 200 is shown in FIG. 3. The tuner 300 performs self-trimming by setting an input reference voltage and enabling the op-amp 302 to push the VCO frequency. Initially, a phase-locked loop frequency synthesizer is set to a mid-range frequency. The op-amp 302 then appropriately pushes the VCO frequency to obtain the correct frequency with a tuning voltage of approximately 1.5 volts. This voltage is converted to a digital form by an analog-to-digital (A/D) converter 304 and stored in read-only memory (ROM) 306.

Finally, a digital-to-analog (D/A) converter 308 converts the stored value into an analog form. This analog voltage provides a constant voltage compensating offset.

An alternative embodiment of the tuner 300 is shown in a dashed line 310. This embodiment performs the digital trimming by frequency pulling. First, the PLL is adjusted to a mid-range frequency. The ROM is then fine tuned to achieve the correct voltage at the varactor node 210. The voltage at the node 210 is set by pulling the VCO frequency. The adjusted voltage is set for a constant voltage offset.

Figure 4:
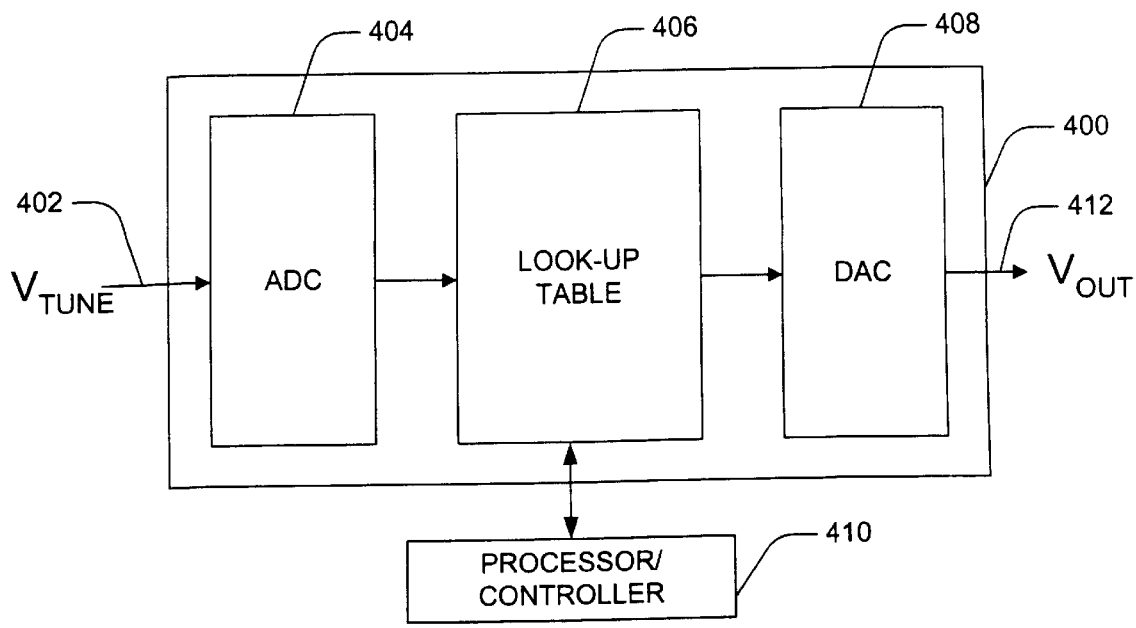
FIG. 4 is another diagram of an input voltage tuner.

FIG. 4 shows a further embodiment of an input voltage tuner 400 using existing components to determine a correction voltage required for an untrimmed VCO to operate at a nominally specified frequency. The components are either unused spares or shared memory spaces.

Figure 5:
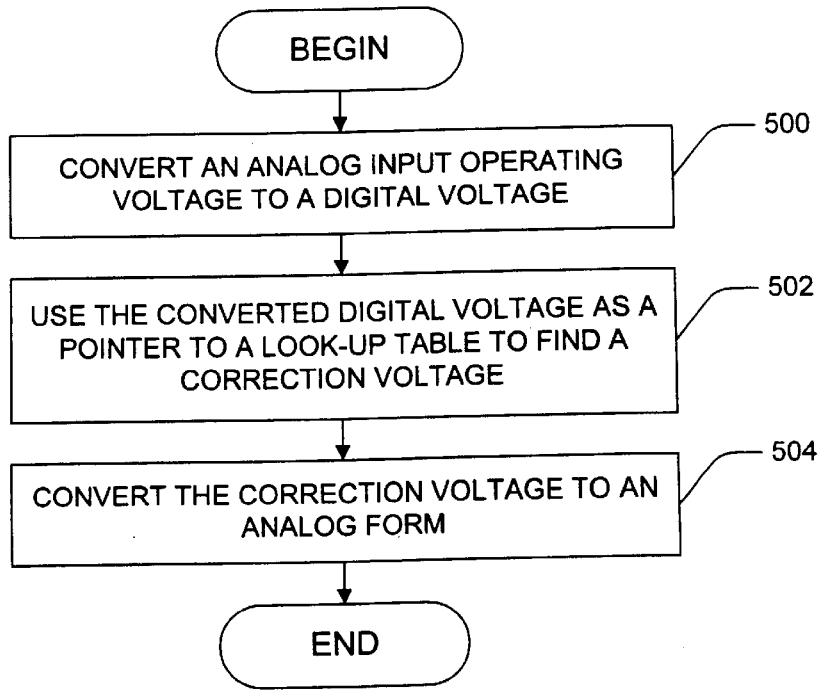
FIG. 5 is a flow diagram of an oscillator tuning process.

FIG. 5 shows a flow diagram of an oscillator tuning process using the input voltage tuner of FIG. 4. As diagramed in FIGS. 4 and 5, an analog input operating voltage 402 is converted to a digital voltage by an analog-to-digital converter (ADC) 404 (step 500). The digital voltage is used as a pointer to a look-up table 406 in a memory such as a flash memory. Cellular phones often use flash memories because they are non-volatile and therefore retain information even when their power supply is removed. A processor/controller 410 then directs the look-up table 406 to provide a digital correction voltage corresponding to the converted digital voltage at step 502. Finally, the correction voltage is converted back to an analog form by a digital-to-analog converter (DAC) 408 to be used as a tuned control voltage 412 (step 504). This voltage 412 is used by the VCO to tune its resonant circuit 104 (FIGS. 1–3) or the adjustable output load 208 (FIGS. 2–3).

Figure 6:
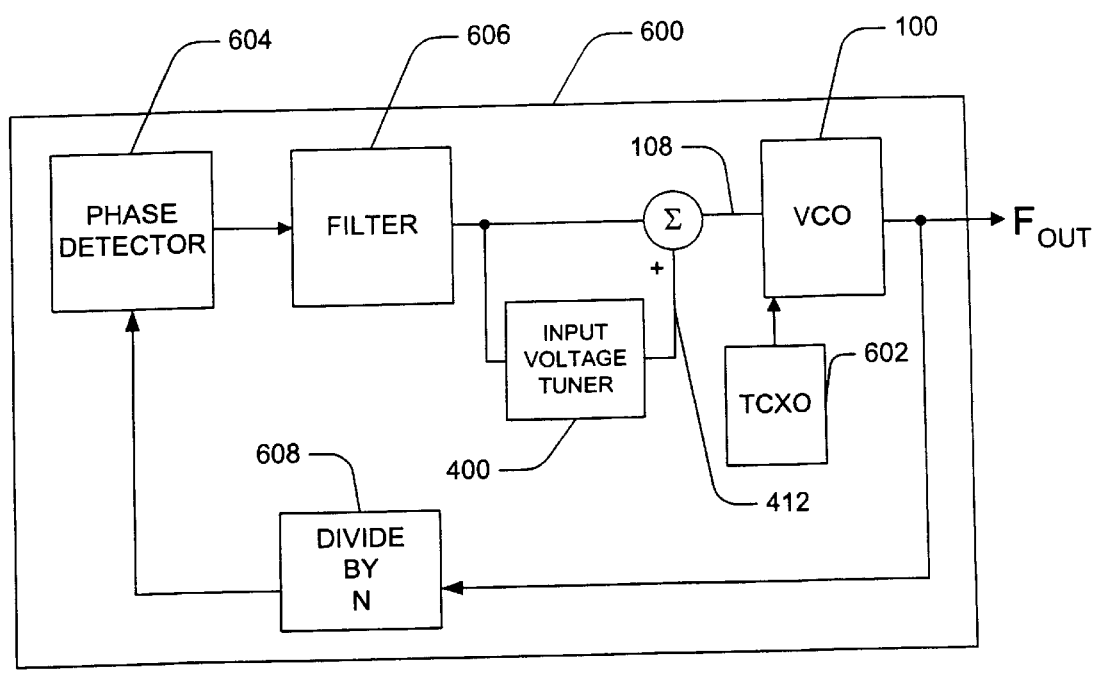
FIG. 6 is a block diagram of a frequency synthesizer.

A frequency synthesizer, such as a phase-locked loop, is often used as an up/down converter in communication devices to provide a local oscillator signal. A block diagram of a frequency synthesizer 600 is shown in FIG. 6. The synthesizer 600 includes a reference oscillator such as a temperature-controlled crystal oscillator (TCXO) 6C2, a frequency divider 608, a phase detector 604, and a loop filter 606. The synthesizer 600 also includes the untrimmed VCO 100 and the input voltage tuner 400 described above. The input voltage tuner 400 is summed into the input node of the VCO 100 to provide an offset voltage such that the phase detector 604 may operate in the center of its tuning range.

Once the synthesizer 600 is incorporated in a communication device, such as a cellular phone, it is calibrated by the tuner 400, and the tuned control voltage 108 is then held constant by the phase-locking function of the PLL. Further, a tuner output control voltage 412 may also be applied elsewhere in the VCO circuit to achieve the nominally specified frequency through "pushing" or "pulling" as described above.

Figure 7:
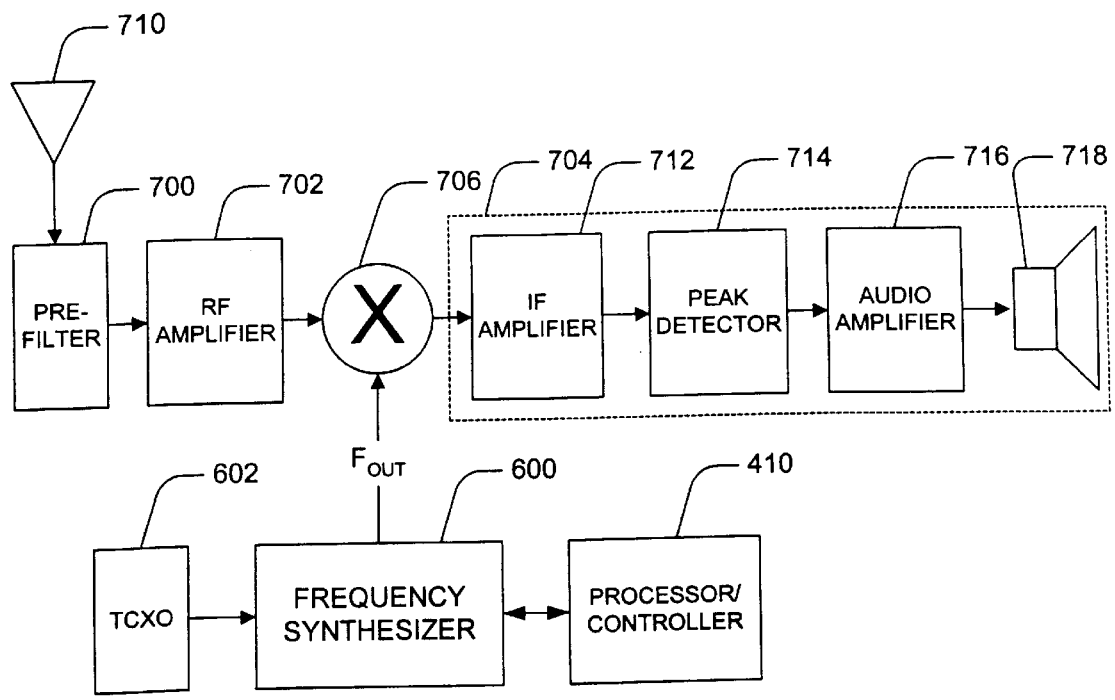
FIG. 7 is a block diagram of a communication device.

A communication device, which includes a frequency oscillator and a frequency synthesizer, can be a transmitter, transceiver, or a receiver. In one embodiment, shown in a block diagram in FIG. 7, a communication receiver comprises a pre-filter 700 and an RF amplifier 702 which provides an output to an associated radio circuitry 704. The pre-filter 700 and the RF amplifier 702 select a band of RF signals received via an antenna 710. The RF amplifier 702 is broadly tuned to select several channels or stations from the spectrum of signals impinging on the antenna 710,.

An intermediate frequency (IF) amplifier 712 in the radio circuitry 704 is a highly selective amplifier with a passband perfectly matched to the bandwidth of a single station and a center frequency at some fixed intermediate frequency. An "intermediate" frequency is a frequency below the RF frequencies coming in on the antenna 710 and above the audio frequencies that constitute the modulation.

The frequency synthesizer 600 includes the tuned VCO. It is tuned to supply a sinusoidal signal, $F_{OUT}$, at a frequency located above the RF frequencies by an amount equal to the intermediate frequency selected by the IF amplifier 712. A mixer 706 forms the product of the incoming RF signal with the sinusoidal signal from the frequency synthesizer 600, and produces both sum and difference frequencies. Whenever the synthesizer 600 is adjusted so that the difference frequencies from a particular station fall within the passband of the IF amplifier 712, the IF amplifier 712 will amplify that particular set of carrier-plus-sidebands while rejecting other nearby spectra. The processor/controller 410 performs synthesizer 600 tuning.

A peak detector 714 demodulates the down-converted signal, and an audio amplifier 716 amplifies the demodulated audio-frequency signal. The audio signal is then sent to a speaker 718.

In another embodiment, the communication device is a transceiver such as in a cellular phone. The synthesizer provides a transmitter local oscillator signal controlled by the VCO. The transmitter and receiver are switchably connected to the antenna under control of the processor/controller 410.

Figure 8:
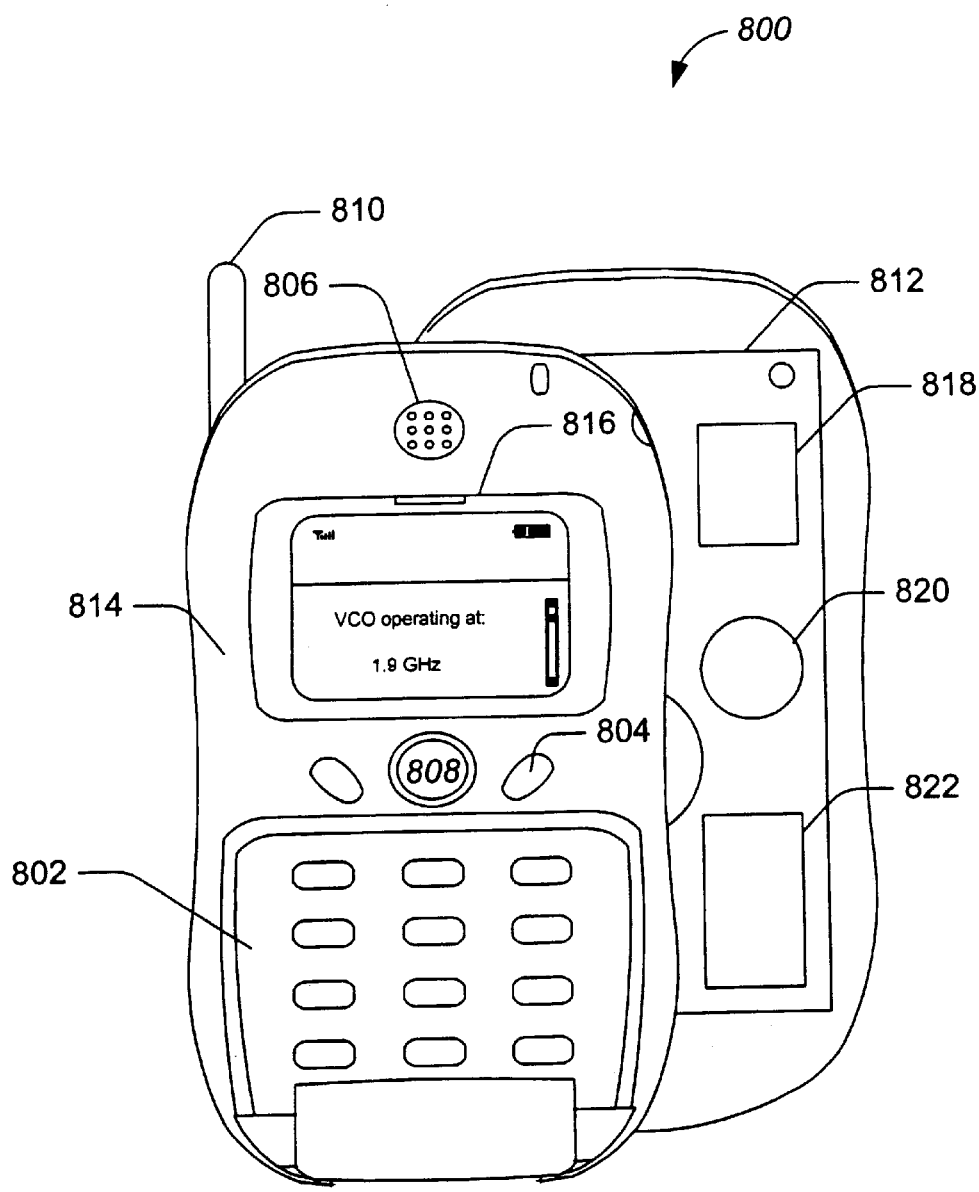
FIG. 8 shows an exploded view of a cellular telephone system.

FIG. 8 shows an exploded view of a cellular telephone system 800 using the VCO controlled frequency synthesizer 600 described above. The cellular telephone system 800 also includes a key pad 802 and various other buttons and indicators 804. The telephone system 800 also includes a speaker 806, a microphone 808, an antenna 810, and other communication electronics 812 contained within a telephone housing 814. A display unit 816 is used in conjunction with the keypad 802 to facilitate user inputs. The communication electronics 812 may include, among others, devices such as the frequency synthesizer 818, the TCXO 820, and the RF amplifier 822.

Figure 9:
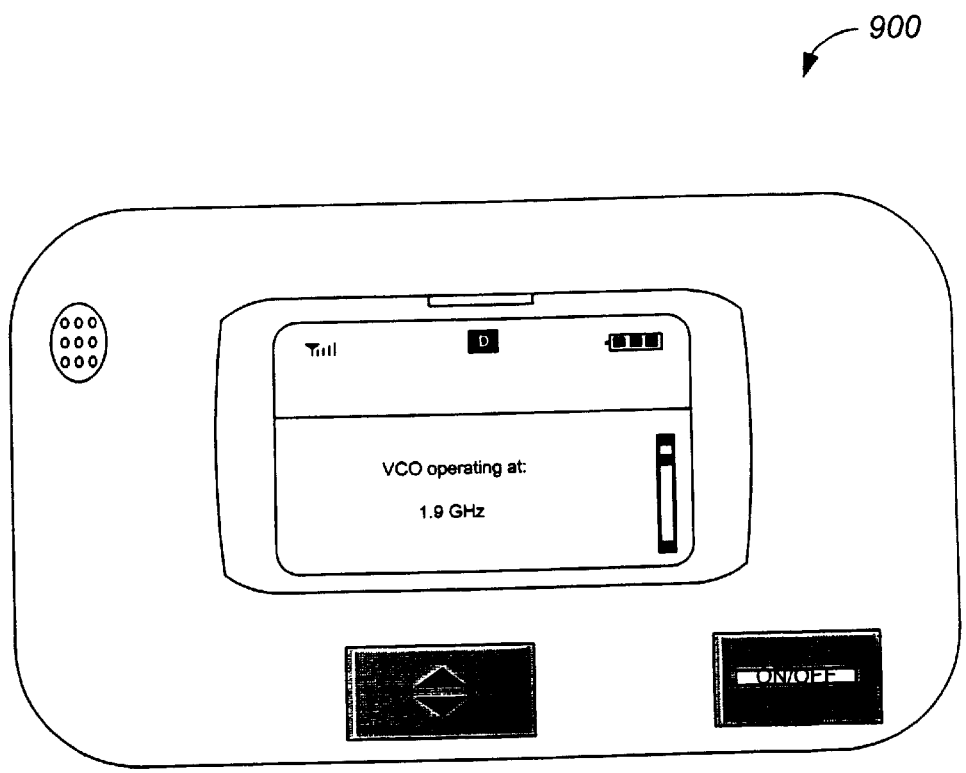
FIG. 9 is a front view of a paging device.

FIG. 9 shows a paging device 900 including the VCO controlled frequency synthesizer 600. The paging device 900 also includes communication electronics similar to those in the cellular telephone system 800.

Advantages of replacing the VCO tuning process at the manufacturing stage with an adjustment of a resonant circuit in the VCO during an operation of the oscillator include a lower cost of VCO as well as a low cost implementation of the tuner using existing components and shared memory spaces.

Other embodiments are within the scope of the following claims. For example, the frequency oscillator described above can be used in other wireless and cellular systems.

What is claimed is:

1. An input voltage tuner for a frequency oscillator, comprising:

a first circuit configured to receive an input tuning signal for the oscillator;

a look-up table which provides a correction value corresponding to said input tuning signal;

a processor operating to control the look-up table during operation of the oscillator, such that the oscillator operates at a nominally specified output frequency;

a second circuit configured to convert said correction value into a form operable by a variable transistor output load; and said variable transistor output load, coupled to a collector of a first transistor, configured to receive the converted correction value from the second circuit and provide frequency pulling where the particular frequency is fine tuned to the nominally specified output frequency of the oscillator.

2. The tuner of claim 1, wherein said first and second circuits are an analog to digital converter and a digital to analog converter, respectively.

* * * * *